(12) United States Patent
Lu et al.

(10) Patent No.: US 6,399,509 B1
(45) Date of Patent: Jun. 4, 2002

(54) DEFECTS REDUCTION FOR A METAL ETCHER

(75) Inventors: Hung-Yueh Lu, Hsin-Chu; Ray C. Lee, Taipei; Hong-Long Chang, Hsin-Chu, all of (TW)

(73) Assignee: Promos Technologies, Inc., Hsin-chu (TW)

( * ) Notice: Subject to any disclaimer, the term of this patent is extended or adjusted under 35 U.S.C. 154(b) by 113 days.

(21) Appl. No.: 09/664,426

(22) Filed: Sep. 18, 2000

(51) Int. Cl.[7] ............................................. H01L 21/302
(52) U.S. Cl. ....................... 438/706; 438/716; 438/712; 438/713; 438/714
(58) Field of Search ................................ 438/706, 710, 438/712, 714, 720, 738, 723; 216/64, 77, 67; 134/1.1, 1.2, 1.3

(56) References Cited

U.S. PATENT DOCUMENTS

| | | | |
|---|---|---|---|
| 5,348,619 A | | 9/1994 | Bohannon et al. ........... 156/664 |
| 5,356,478 A | * | 10/1994 | Chen et al. ..................... 134/1 |
| 5,700,740 A | * | 12/1997 | Chen et al. ................. 438/710 |
| 5,755,891 A | | 5/1998 | Lo et al. ....................... 134/1.2 |
| 5,814,155 A | | 9/1998 | Solis et al. ..................... 134/1 |
| 5,827,437 A | * | 10/1998 | Yang et al. .................... 216/77 |
| 5,851,302 A | | 12/1998 | Solis ........................... 134/1.2 |

* cited by examiner

Primary Examiner—Benjamin L. Utech
Assistant Examiner—Lan Vinh
(74) Attorney, Agent, or Firm—George O. Saile; Stephen B. Ackerman; William J. Stoffel

(57) ABSTRACT

A method of patterning a metal line and removing the polymer layer that forms on the metal lines sidewalls in an important post etch-polymer removal step (e.g., step 4). A semiconductor structure and an overlying dielectric layer, a first barrier layer, a metal layer; a second barrier layer and resist pattern are provided. A four step etch process is performed in sequence in the same etch chamber. In a first etch step (A), we etch through the second barrier layer using a B and Cl containing gas and a Cl containing gas in a reactive ion etch to form a first polymer layer over the sidewall of the second barrier layer. In a second etch step (B), the metal layer is etched exposing the first barrier layer to form a second polymer over the first polymer and the sidewall of the metal layer; the second etch step performed using a B and Cl containing gas and a Cl containing gas. In a third etch step (C), the first barrier layer is etched to form a third polymer layer over the first and second polymer layers. The third etch step is performed using a B and Cl containing gas and a Cl containing gas. In an important fourth etch step (D), we remove the first, second and third polymers; the fourth etch step performed using only chlorine containing gas ($Cl_2$) gas and a fluorocarbon containing gas.

16 Claims, 2 Drawing Sheets

DEFECTS REDUCTION FOR A METAL ETCHER

BACKGROUND OF INVENTION

1) Field of the Invention

This invention relates generally to fabrication of semiconductor devices, and to the manufacture of integrated circuits, and more particularly to the formation of device interconnections on semiconductor integrated circuits by etching of a metal layer with gaseous reagents assisted by electrical plasma excitation of the reactive medium and to methods of selectively removing sidewall polymers from metal lines.

2) Description of the Prior Art

The density of devices fabricated on semiconductor substrates has increased steadily over the years with ultra large scale integration. Accompanying this trend have been decreased feature sizes and increased demands on process technology. Patterns of fine conductive lines are required to interconnect electronic devices thereon, in order to carry electrical signals and to distribute electrical current and power to the devices. It is very desirable to use metals of high electrical conductivity for this purpose to minimize power loss and undesirable heating. The preferred materials for this purpose are aluminum and its alloys, particularly with copper. The economic benefit from reducing overall device dimensions derives from the lower unit cost per device if more devices can be fabricated per unit area of semiconductor substrate. The desire for finer lines follows directly, and has resulted in the development of methods for accurate and precise fabrication of metallic linewidths and spacings of the order of several microns. This is accomplished by methods of etching of the metallic layers by means of gas-phase removal of the metallic material selectively exposed by an appropriate photoresist pattern. This process is often enhanced and improved by carrying it out in the presence of an electrical plasma sustained in the reactive gaseous etching mixture by input of radio frequency power to the reaction chamber. The desired high rates and selectivity of etching of aluminum and its alloys are readily attained by use of gaseous compounds containing chlorine such as chloroform, for example.

In addition, the resist is difficult to remove as a result of larger amounts of etch byproducts such as sidewall polymer on vertical walls of a device undergoing fabrication. These byproducts, generally referred to as polymers are generally comprised of a metal and $SiO_2$ molecule. For instance, the molecule can comprise carbon from the photoresist, metal from the metal layer and $SiO_2$. Further, sidewall polymers may comprise aluminum silicate and very small amounts of fluorocarbons. Fluorocarbons are non-combustible and therefor are not removed during an $O_2$ in-situ ash sequence of a metal etch. Thus, ashing has proven to be ineffective because of the high carbon content in the byproduct molecule from the photoresist. The difficulty with which resist can be removed has proven to be a sever impediment to the generation of sub-half micron features. Previously solvent/ultrasonic agitation had been used to remove SWP. However, these techniques prove to be unusable because of the tendency of metal, such as aluminum, to lift off of the minimum features. Further, these techniques tend to leave behind significant amounts of residue on device sidewalls and on device surfaces.

For the reasons cited, it has been found beneficial to carry out a post-etching procedure subsequent to metal pattern etching. Removal of the device substrates from the reaction chamber followed by exposure to solvent or aqueous cleaning media has been one solution. Another procedure has been a subsequent exposure of the devices to a RF plasma sustained in an oxygen (O2) gas environment, which has been found to be beneficial in removing residues containing trapped Cl-containing species, and in minimizing the amount of intractable polymer surface skin on the photoresist which interferes with the stripping of the latter material. It has been reported that the use of fluorine-containing gases provides a suitable post-etching treatment for reducing Cl-containing residues after gas-phase etching of aluminum. It is thought that this process substitutes F atoms for the Cl atoms in the residues, or coats the residues with an impervious fresh polymer and limits access to the trapped Cl atoms by water.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,851,302(Solis) shows a method for dry etching sidewall polymer.

U.S. Pat. No. 5,348,619(Bohannon et al.) teaches a metal selective polymer removal process.

U.S. Pat. No. 5,755,891(Lo et al.) shows a post metal etch process.

U.S. Pat. No. 5,814,155(Solis et al.) shows plasma ashing polymer/photoresist removal processes.

SUMMARY OF THE INVENTION

It is an object of the present invention to provide a method for etching a metal line and removing the polymer that is formed on the sidewalls of the metal lines.

It is an object of the present invention to provide a method for etching a Aluminum alloy metal line and removing the polymer that is formed on the sidewalls of the metal lines using a chlorine containing (e.g., $Cl_2$) and fluorine containing (e.g., $CF_4$) post etch polymer removal step.

It is an object of the present invention to provide a method for etching a aluminum alloy metal line having a Ti/TiN anti-reflective coating layer and a Ti underlayer and removing the polymer that is formed on the sidewalls of the metal lines using a chlorine containing (e.g., $Cl_2$) and fluorine containing (e.g., $CF_4$) post etch clean step.

To accomplish the above objectives, the present invention provides a method of patterning a metal line and removing the polymer layer that forms on the metal lines sidewalls in a post etch-clean step. The method can be summarized as follows. A semiconductor structure and an overlying dielectric layer are provided over the dielectric layer, a first barrier layer, a metal layer; a second barrier layer are provided. A resist pattern over the second barrier layer is provided. We perform a four step etch process, in sequence in the same etch chamber. In a first etch step (A); we etch through the second barrier layer using a B and Cl containing gas and a Cl containing gas in a reactive ion etch to form a first polymer layer over the sidewall of the second barrier layer. In a second etch step (B); the metal layer is etched exposing the first barrier layer to form a second polymer over the first polymer and the sidewall of the metal layer; the second etch step performed using a B and Cl containing gas and a Cl containing gas. In a third etch,step (C); the first barrier layer is etched to form a third polymer layer over the first and second polymer layers; the third etch step performed using a B and Cl containing gas and a Cl containing gas. In an important fourth etch step (D); we remove the first, second and third polymers; the fourth etch step performed using only chlorine containing gas (Cl$_2$) gas and a fluorocarbon containing gas.

The invention's etch process removes the polymer on the sidewalls of metal lines. The key fourth step removes the sidewall polymer layer(s).

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. A preferred embodiment of the invention is described below.

Figure 1:
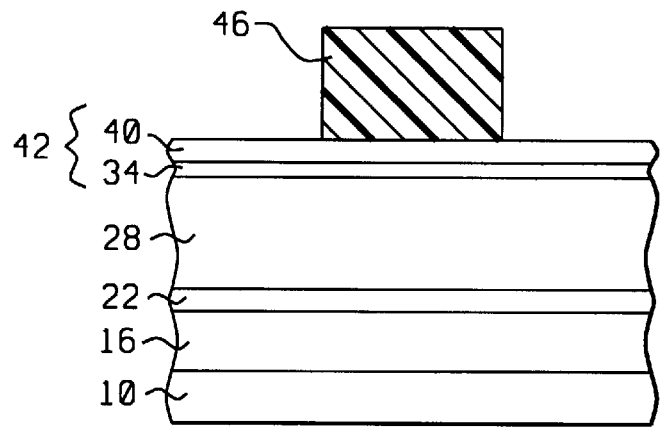
FIGS. 1 through 5 are cross sectional views for illustrating a preferred embodiment of a process for patterning a metal line and removing a polymer layer according to the present invention.

Providing a Metal Line Structure—FIG. 1

As shown in FIG. 1, a semiconductor structure 10 and an overlying dielectric layer 16 are provided. The semiconductor structure 10 is understood to possibly include a semiconductor wafer, active and passive devices formed within the wafer and layers formed on the wafer surface. The dielectric layer can be an interlevel dielectric (ILD) or inter metal dielectric (IMD) layer and is preferably comprised of silicon oxide.

Still referring to FIG. 1, a first barrier layer 22, a metal layer 28; a second barrier layer 42 are formed over the dielectric layer 16.

The first barrier layer 22 preferably comprised of Ti and has a thickness of between about 70 and 130 Å and most preferably 100 Å (+/−10 Å).

The metal layer 28 is preferably comprised of an Al alloy and having a thickness of between about 2100 and 2700 Å and most preferably 2400 Å (+/−10 Å).

The second barrier layer 42 is preferably comprised of a lower Ti layer 34 and an upper TiN layer 40.

The lower Ti layer 34 has a thickness of between about 45 and 55 Å, and most preferably 45 to 50 Å.

The upper TiN layer 40 preferably has a thickness of between about 360 and 440 Å and most preferably 400 Å (+/−10 Å).

A photoresist pattern 46 is formed over the second barrier layer 42. The photoresist is preferably a positive DUV photoresist. DUV photoresists often contain Novalak Resins that make the polymer problem worse. That is the polymers are harder to remove. It is important to understand the invention works unexpectedly well on DUV photoresist that contain Nocalak Resins, much better that the prior art methods. The Nacalak resins exist in all the polymer produced by the invention steps. The photoresist is preferably soluble in ACT 935 (e.g., contains hydroxylamine, monoethanolamine).

The resist layer is preferably composed of a DUV positive photoresist, such as made by TOK and Shipley.

4 Step Insitu Etch of the Invention

Next, the invention's four step etch process is performed. The etch process is preferably performed insitu. The etch is preferably performed in one etcher, in sequence with no intervening steps, without breaking vacuum or removing the wafers from the etcher.

Step 1

Figure 2:
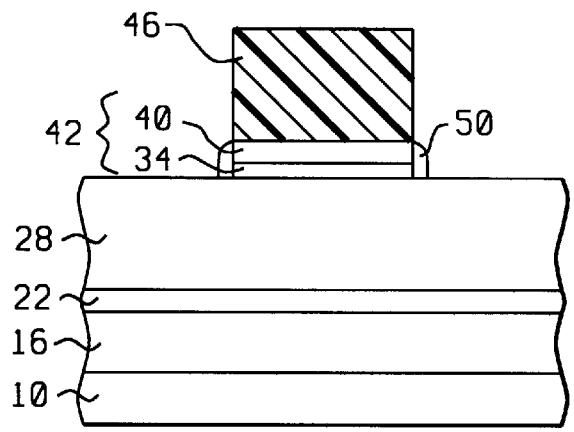

As shown in FIG. 2, in a first etch step (break thru step) (A); we etch through the second barrier layer 42 using a B and Cl containing gas (such as BCl$_3$) and a Cl containing gas (such as HCl or Cl$_2$) in a reactive ion etch to form a first polymer layer 50 over the sidewall of the second barrier layer 42.

The first polymer layer is comprised of a Ti and TiN containing polymer. The polymer layers formed in each are comprised of chemicals from the etch gases, photoresist, barrier layers and etcher and other environmental contaminants.

The first etch step is performed under the following conditions: a pressure between 7 and 13 mtorr, a TCP power between 230 and 260 W, a bias power between 220 and 250 W, a chlorine containing gas (e.g., Cl$_2$) to B and Cl containing gas (e.g., BCl$_3$) flow ratio between 0.9 to 1.1; for a time between 8 and 12 seconds. Most preferably at a Cl$_2$ flow between 55 and 65 sccm and a BCl$_3$ flow between 55 and 65 sccm. For all etch steps in the invention, the gas flows can be varied for other etches by keeping the molar flow ratios the same.

Step 2

Figure 3:
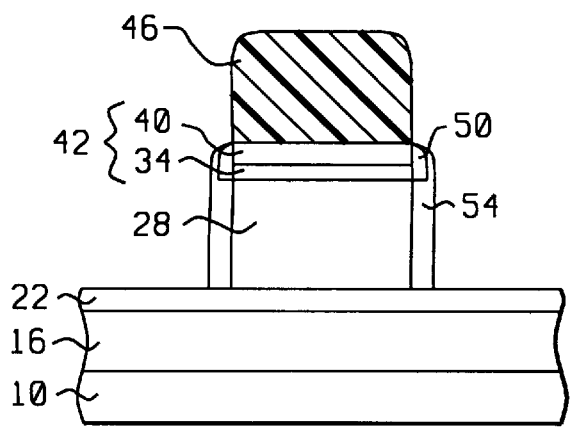

As shown in FIG. 3, in a second etch step (B) (main metal etch step), we etch the metal layer exposing the first barrier layer to form a second polymer over the first polymer and the sidewall of the metal layer; the second etch step performed using a B and Cl containing gas (such as BCl$_3$) and a Cl containing gas (such as HCl or Cl$_2$).

The second polymer is preferably comprised of an Al containing polymer. Polymer is a carbon containing compound.

The second etch step is preferably performed under the following conditions: a pressure between 7 and 13 mtorr, a TCP power between 230 and 260 W, a bias power between 220 and 250 W, a Cl$_2$ flow between 45 and 55 sccm and a BCl$_3$ flow between 35 and 45 sccm; and a nitrogen flow between 3 to 9 sccm, for a time between 45 and 55 seconds.

Step 3

Figure 4:
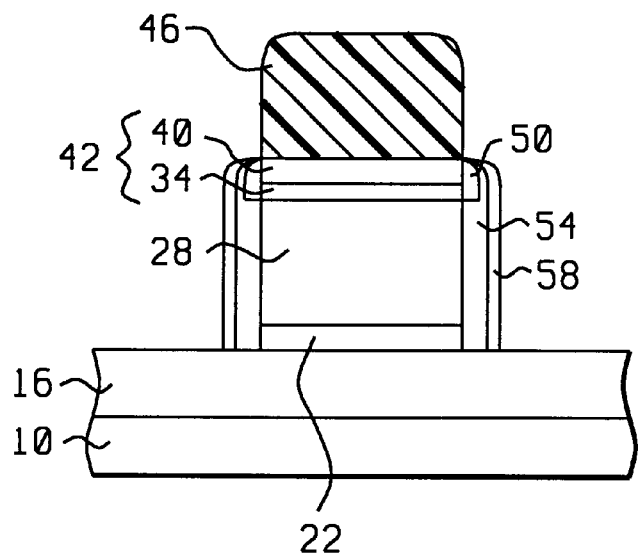

As shown in FIG. 4, in a third etch step (C) (over etch step), we etch the first barrier layer 22 to form a third polymer layer 58 over the first and second polymer layers 50 54; the third etch step performed using a B and Cl containing gas (such as BCl$_3$) and a Cl containing gas (such as HCl or Cl$_2$).

The third polymer comprised of a Ti and silicon oxide containing polymer.

The third etch step is preferably performed under the following conditions: a pressure between 7 and 13 mtorr, a TCP power between 230 and 260 W, a bias power between 260 and 280 W, a chlorine containing gas (e.g., Cl$_2$) flow between 45 and 55 sccm and a boron containing gas (BCl$_3$) flow between 45 and 55 sccm; and a nitrogen flow between 3 to 9 sccm, for a time between 8 and 12 seconds.

4th Etch Step—Polymer Removal Step

Figure 5:
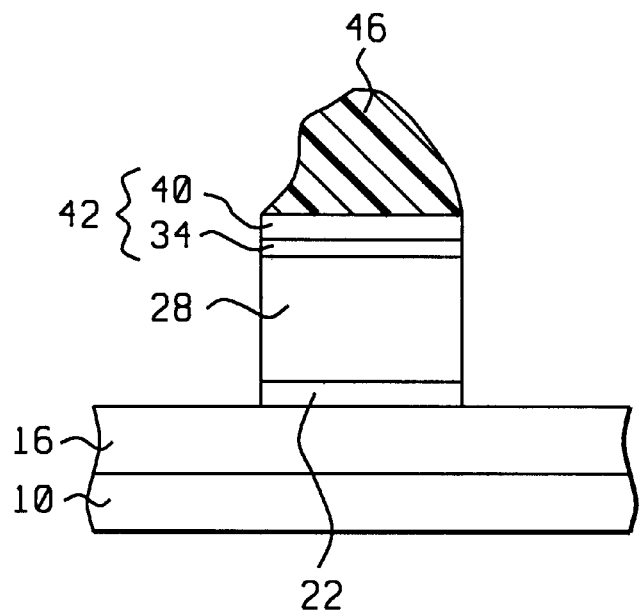

As shown in FIG. 5, in a fourth etch step (D) (polymer removal step); we remove the first, second and third polymers 50 54 58. The fourth etch step is performed using only chlorine containing gas ($Cl_2$) gas and a fluorocarbon containing gas (such as $CF_4$ or $CHF_3$, $CH_2F_2$ and $CH_3F$).

The fourth etch step is preferably performed under the following conditions: a pressure between 7 and 13 mtorr, a TCP power between 230 and 260 W, a bias power between 260 and 280 W, a (chlorine containing gas) $Cl_2$ flow between 45 and 55 sccm and a (fluorocarbon gas) $CF_4$ flow between 115 and 135 sccm, for a time between 18 and 22 seconds.

It is critical to note that the invention's 4 step process does not form a polymer layer over the metal layers. This is in contrast to some prior art processes that intentionally form a polymer protection layer over the metal line and sidewalls using a fluorine containing gas.

The four step etch process is preferably performed in a LAM TCP (transformer coupled plasma) type etcher, model 9600. The inventors have found the the TCP configuration work unexpectedly well in removing polymer using the invention's process. It is thought that the TCP configuration provides some benefit. However, other type etchers could be used.

After the fourth step, a post clean step is performed. After in invention's four step process, the post clean preferably bathing time in ACT is reduced to about 5 min (4 to 6 minutes).

Without the invention's fourth step, the post clean must will run by bathing in ACT for at least 20 min. That is the invention's 3 steps significantly reduce the post clean time and make the post clean optional. In contrast, the previous process required at least a 20 minute post clean and the polymers were not adequately removed caused yield losses.

EXAMPLE

The following non-limiting examples represent preferred forms and best modes contemplated by the inventor for practice of his invention, as well as illustrating the results obtained through its use.

The process below was used to successfully pattern and remove sidewall polymer from the structure shown in FIGS. 1 to 5.

Step 1 (Break thru step) FIG. 2—10 seconds/10 mT/250 W (TCP power)/230(bias power)/60 Cl sccm/60 $BCl_3$ sccm Step 2 (metal etch step) FIG. 3—50 seconds (EPD)/10 mT/250 W (TCP power)/230(bias power)/50 $Cl_2$ sccm/40 $BCl_3$ sccm/6 $N_2$ sccm/(using a end point detection (EPD) to stop the etch step).

Step 3 (Over etch step) FIG. 4—10 seconds/10 mT/250 W (TCP power)/270(bias power)/50 $Cl_2$ sccm/50 $BCl_3$ sccm/6 $N_2$ Step 4 (polymer removal step) FIG. 5—20 seconds/10 mT/250 W (TCP power)/270(bias power)/50 Cl sccm/ 125 $CF_4$ sccm The etch process was performed insitu in a LAM TCP modeletcher. The process parameters(e.g., flow, pressure, temperature) can be used plus/minus 10%.

Referring to FIGS. 1 to 5, for this example: layer 16 is oxide, layer 22 is Ti, layer 28 is an Al alloy, layer 34 is Ti, layer 40 is TiN and layer 46 is positive DUV photoresist (containing Novalak Resins).

BENEFITS

The invention's etch process removes the polymer on the sidewalls of metal lines. The key fourth step removes the sidewall polymer. In particular, the invention's 4 step process shows unexpected results with the invention's Specific structure (e.g., layer 16 is oxide, layer 22 is Ti, layer 28 is an Al alloy, layer 34 is Ti, layer 40 is TiN and layer 46 is positive photoresist) . It is theorized step (4) $Cl_2$ and $CF_4$ mixture provides a unexpectedly good etch for the specific 3 polymer layers 50 54 58 created by the exact gas compositions of the etch steps 1 to 3 and the exact chemical compositions of the layers.

It is critical to note that the invention's 4 step etch does not form a polymer layer over the metal layers. This is in contrast to some prior art processes that intentionally form a polymer protection layer over the metal line and sidewalls using a fluorine containing gas.

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge. The term "aluminum" includes alloys of aluminum of the kind typically used in the semiconductor industry. Such alloys include aluminum-copper alloys, and aluminum-copper-silicon alloys, for example. The preferred embodiments described herein were for aluminum comprising about 0.5% copper.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art. Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of patterning and insitu cleaning a metal line for a semiconductor device; comprising the steps of
    a) providing a semiconductor structure and an overlying dielectric layer; providing over said dielectric layer, a first barrier layer, a metal layer, and a second barrier layer;
    b) providing a resist pattern over said second barrier layer;

c) performing a four step etch process, in sequence in the same etch chamber, comprising:
   (1) in a first etch step (A); etching through said second barrier layer using a B and Cl containing gas and a Cl containing gas in a reactive ion etch to form a first polymer layer over the sidewall of said second barrier layer;
   (2) in a second etch step (B); etching said metal layer exposing said first barrier layer to form a second polymer over said first polymer and the sidewall of said metal layer; the second etch step performed using a B and Cl containing gas and a Cl containing gas;
   (3) in a third etch step (C); etching said first barrier layer to form a third polymer layer over said first and second polymer layers; the third etch step performed using a B and Cl containing gas and a Cl containing gas;
   (4) in a fourth etch step (D); removing said first, second and third polymers; the fourth etch step performed using only chlorine containing gas and a fluorocarbon containing gas.

2. The method of claim 1 wherein the four step etch process is performed in a TCP (transformer coupled plasma) type etcher.

3. The method of claim 1 wherein said first barrier layer is comprised of Ti and has a thickness of between about 70 and 130 Å.

4. The method of claim 1 wherein said metal layer is comprised of an Al alloy and having a thickness of between about 2100 and 2700 Å.

5. The method of claim 1 wherein said second barrier layer is comprised of a lower Ti layer and a upper TiN layer, said upper TiN layer has a thickness of between about 360 and 440 Å and said lower Ti layer has a thickness of between about 45 and 55 Å.

6. The method of claim 1 wherein said first polymer layer is comprised of a Ti and TiN containing polymer containing Novalak Resins.

7. The method of claim 1 wherein said first etch step is performed under the following conditions: a pressure between 7 and 13 mtorr, a TCP (transformer coupled plasma) power between 230 and 260 W, a bias power between 220 and 250 W, a $Cl_2$ to $BCl_3$ flow ratio between 0.9 to 1.1; for a time between 8 and 12 seconds.

8. The method of claim 1 wherein said second polymer layer is comprised of an Al containing polymer.

9. The method of claim 1 wherein said second etch step is performed under the following conditions: a pressure between 7 and 13 mtorr, a TCP (transformer coupled plasma) power between 230 and 260 W, a bias power between 220 and 250 W, a $Cl_2$ flow between 45 and 55 sccm and a $BCl_3$ flow between 35 and 45 sccm; and a nitrogen flow between 3 to 9 sccm, for a time between 45 and 55 seconds.

10. The method of claim 1 wherein said third polymer layer is comprised of a Ti and silicon oxide containing polymer.

11. The method of claim 1 wherein said third etch step is performed under the following conditions: a pressure between 7 and 13 mtorr, a TCP (transformer coupled plasma) power between 230 and 260 W, a bias power between 260 and 280 W, a chlorine containing gas flow between 45 and 55 sccm and a boron and Chlorine containing gas flow between 45 and 55 sccm; and a nitrogen flow between 3 to 9 sccm, for a time between 8 and 12 seconds.

12. The method of claim 1 wherein said fourth etch step is performed under the following conditions: a pressure between 7 and 13 mtorr, a TCP (transformer coupled plasma) power between 230 and 260 W, a bias power between 260 and 280 W, a $Cl_2$ flow between 45 and 55 sccm and a CF4 flow between 115 and 135 sccm; for a time between 18 and 22 seconds.

13. The method of claim 1 wherein said resist pattern is comprised of a DUV resist containing novalak resins.

14. The method of claim 1 wherein the four step etch process is performed in a TCP (transformer coupled plasma) type etcher.

15. A method of patterning and insitu cleaning a metal line for a semiconductor device; comprising the steps of
   a) providing a semiconductor structure and an overlying dielectric layer; providing over said dielectric layer, a first barrier layer, a metal layer; a second barrier layer;
     (1) said first barrier layer comprised of Ti and has a thickness of between about 70 and 130 Å;
     (2) said metal layer comprised of an Al alloy and having a thickness of between about 2100 and 2700 Å;
     (3) said second barrier layer comprised of a lower Ti layer and a upper TiN layer, said upper TiN layer has a thickness of between about 360 and 440 Å; and said lower Ti layer has a thickness of between about 45 and 55 Å;
   b) providing a resist pattern over said second barrier layer; said resist pattern is comprised of a deep ultra violet (DUV) resist containing novalak resins;
   c) performing a four step etch process, in sequence in the same etch chamber, comprising:
     (1) in a first etch step (A); etching through said second barrier layer using a B and Cl containing gas and a Cl containing gas in a reactive ion etch to form a first polymer layer over the sidewall of said second barrier layer;
       (a) said first polymer layer is comprised of a Ti and TiN containing polymer;
       (b) said first etch step is performed under the following conditions: a pressure between 7 and 13 mtorr, a TCP (transformer coupled plasma) power between 230 and 260 W, a bias power between 220 and 250 W, a $Cl_2$ flow between 55 and 65 sccm and a $BCl_3$ flow between 55 and 65 sccm; for a time between 8 and 12 seconds;
     (2) in a second etch step (B); etching said metal layer exposing said first barrier layer to form a second polymer over said first polymer and the sidewall of said metal layer; the second etch step performed using a B and Cl containing gas and a Cl containing gas;
       (a) said second polymer comprised of a Al containing polymer;
       (b) said second etch step is performed under the following conditions: a pressure between 7 and 13 mtorr, a TCP (transformer coupled plasma) power between 230 and 260 W, a bias power between 220 and 250 W, a $Cl_2$ flow between 45 and 55 sccm and a $BCl_3$ flow between 35 and 45 sccm; and a nitrogen flow between 3 to 9 sccm, for a time between 45 and 55 seconds;
     (3) in a third etch step (C); etching said first barrier layer to form a third polymer layer over said first and second polymer layers; the third etch step performed using a B and Cl containing gas and a Cl containing gas;
       (a) said third polymer comprised of a Ti and silicon oxide containing polymer;

(b) said third etch step is performed under the following conditions: a pressure between 7 and 13 mtorr, a TCP (transformer coupled plasma) power between 230 and 260 W, a bias power between 260 and 280 W, a $Cl_2$ flow between 45 and 55 sccm and $BCl_3$ flow between 45 and 55 sccm; and a nitrogen flow between 3 to 9 sccm, for a time between 8 and 12 seconds;

(4) in a fourth etch step (D); removing said first, second and third polymers; the fourth etch step performed using only $Cl_2$ gas and a $CF_4$;

(a) said fourth etch step is performed under the following conditions: a pressure between 7 and 13 mtorr, a TCP (transformer coupled plasma) power between 230 and 260 W, a bias power between 260 and 280 W, a $Cl_2$ flow between 45 and 55 sccm and a gas CF4 flow between 115 and 135 sccm, for a time between 18 and 22 seconds.

16. A method of patterning and insitu cleaning a metal line for a semiconductor device; comprising the steps of:

a) providing a semiconductor structure and an overlying dielectric layer; providing over said dielectric layer, a metal layer and a overlying resist pattern;

b) performing a at least two step etch process, in sequence in the same etch chamber, comprising:

(1) in a first etch step, etching said metal layer to form polymer layer and the sidewall of said metal layer; the first etch step performed using a B and Cl containing gas and a Cl containing gas; and (2) in a polymer removal etch step, removing said polymer layer; the polymer removal etch step performed using only chlorine containing gas and a fluorocarbon containing gas.

* * * * *